United States Patent [19]

Drage

[11] Patent Number: 4,793,975
[45] Date of Patent: Dec. 27, 1988

[54] PLASMA REACTOR WITH REMOVABLE INSERT

[75] Inventor: David J. Drage, Sebastopol, Calif.

[73] Assignee: Tegal Corporation, Petaluma, Calif.

[21] Appl. No.: 45,260

[22] Filed: Apr. 24, 1987

Related U.S. Application Data

[63] Continuation of Ser. No. 736,032, May 20, 1985.

[51] Int. Cl.⁴ .................. B01J 19/08; C23C 15/00; C23F 1/02
[52] U.S. Cl. .................... 422/186.05; 422/186.06; 422/906; 204/298; 156/345; 219/121.4; 219/121.43
[58] Field of Search ............... 204/298; 156/345; 422/186.05, 186.06, 906, 907; 219/121 PR, 121 PD, 121 PG

[56] References Cited

U.S. PATENT DOCUMENTS

| | | | |
|---|---|---|---|
| 4,367,114 | 1/1983 | Steinberg et al. | 219/121 PD X |
| 4,384,938 | 5/1983 | Desilets et al. | 204/298 |
| 4,430,184 | 2/1984 | Mularie | 204/298 |
| 4,448,659 | 5/1984 | Morrison, Jr. | 204/298 |
| 4,464,223 | 8/1984 | Gorin | 156/345 |
| 4,482,419 | 11/1984 | Tsukada et al. | 156/345 |
| 4,485,000 | 11/1984 | Kawaguchi et al. | 204/298 |
| 4,521,286 | 6/1985 | Horwitz | 204/192 E |
| 4,534,816 | 8/1985 | Chen et al. | 156/345 |
| 4,585,920 | 4/1986 | Houg et al. | 156/345 X |
| 4,590,042 | 5/1986 | Drage | 156/345 X |
| 4,654,106 | 3/1987 | Davis et al. | |

Primary Examiner—John F. Terapane
Assistant Examiner—Susan Wolffe
Attorney, Agent, or Firm—Paul F. Wille

[57] ABSTRACT

A parallel plate plasma reactor is disclosed in which the lower electrode comprises a metal electrode having a central pedestal and an insert for surrounding the pedestal and holding wafers in contact with the pedestal or in position above the pedestal. The insert can comprise an insulator, such as ceramic, or a metal.

7 Claims, 2 Drawing Sheets

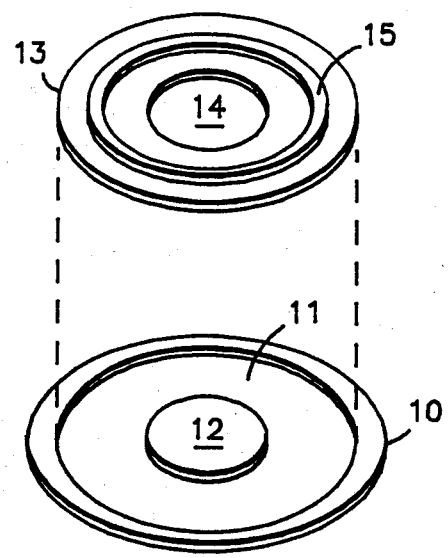
FIG. 1
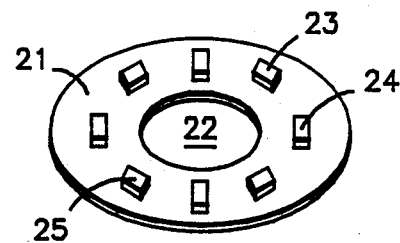
FIG. 2
FIG. 4
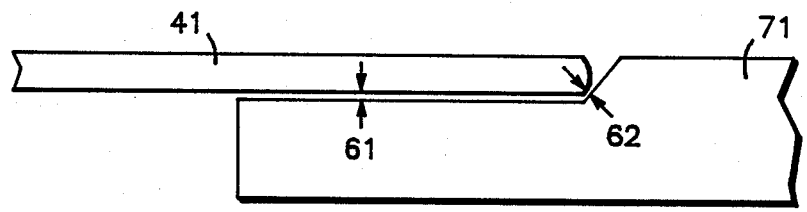
FIG. 5
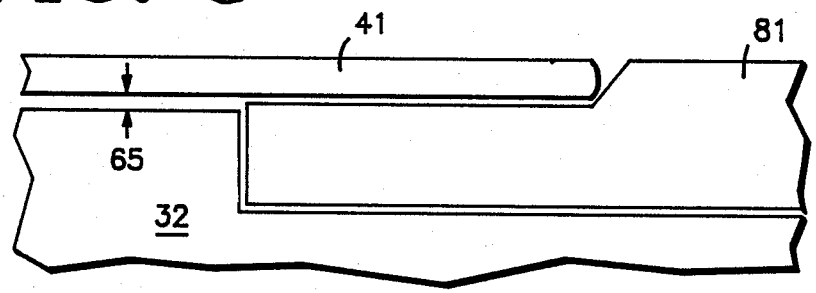

PLASMA REACTOR WITH REMOVABLE INSERT

This application is a continuation of application Ser. No. 736,032 filed May 20, 1985.

BACKGROUND OF THE INVENTION

This invention relates to plasma reactors and, in particular, to parallel plate plasma reactors.

As known in the art, the plasma reaction in a chamber, whether it be to deposit or remove material, is a complex balance of many parameters. It is recognized, for example in U.S. Pat. No. 4,473,436, that reactor geometry has an effect on the nature of an etch. Thus, not only must the gas or gas mixture, pressure, substrate temperature, power etc. be chosen with care, the design of the reactor chamber itself becomes a compromise among competing interests.

In the past, plasma reactors have been single function machines, at least outside the laboratory. Thus, for example, converting a frontside etch reactor to a backside etch reactor involved a substantial reconstruction of the machine, e.g. the lower electrode assembly in a parallel plate reactor must be modified or replaced.

While swapping sub-assemblies may seem feasible, one must consider their cost as well as the need to avoid corners, i.e. outside corners, pockets, i.e. inside corners, and gaps, all of which may deteriorate the performance of the reactor. In the case of parallel plate reactors, it is not practical to swap complete lower electrode assemblies due to the plumbing and electrical connections as well as the cost of machining the electrode.

Further, the materials used in the reactor chamber, or at least their surface finish, often required modification in order to accommodate various processes. When this is combined with the number of wafer sizes now in use, it is apparent that there is a large number of processes and wafer sizes confronting the manufacturer of plasma reactors. Yet, to reduce manufacturing costs, the proliferation of possibilities must somehow be accommodated. At the same time, the customer or user wants improved performance, e.g. better uniformity, higher etch rates, better anisotropy and/or selectivity. Thus, any change in the equipment to make it more flexible cannot reduce performance. In fact, if the change does not improve performance, it is unlikely that a customer would be interested in buying the reactor.

In view of the foregoing, it is therefore an object of the present invention to enable a single plasma reactor to be used for a variety of processes.

It is another object of the present invention to improve the etch rate of a plasma reactor.

It is a further object of the present invention to improve the uniformity of a plasma reactor.

It is another object of the present invention to simultaneously improve the flexibility and performance of a plasma reactor.

SUMMARY OF THE INVENTION

The foregoing objects are achieved in the present invention wherein there is provided a planar lower electrode having an annular groove defining a central pedestal. A ring fits within the groove and contains a ridge on the upper surface thereof for containing a wafer to be processed. By choice of the material for the ring, the thickness of the ring, and the diameter of the ridge, a variety of processes and wafer diameters can be accommodated. It was found, but was not expected, that the ring improved uniformity and etch rate in cooperation with other elements of the plasma reactor.

BRIEF DESCRIPTION OF THE DRAWINGS

A more complete understanding of the present invention can be obtained by considering the following detailed description in conjunction with the accompanying drawings, in which:

FIG. 1 illustrates the lower electrode of a plasma reactor and the ring in accordance with the present invention.

FIG. 2 illustrates an alternative embodiment of the ring.

FIG. 4 illustrates a detail of the present invention concerning frontside etch.

FIG. 5 illustrates a detail of the present invention concerning backside etch.

DETAILED DESCRIPTION OF THE INVENTION

Figure 3:
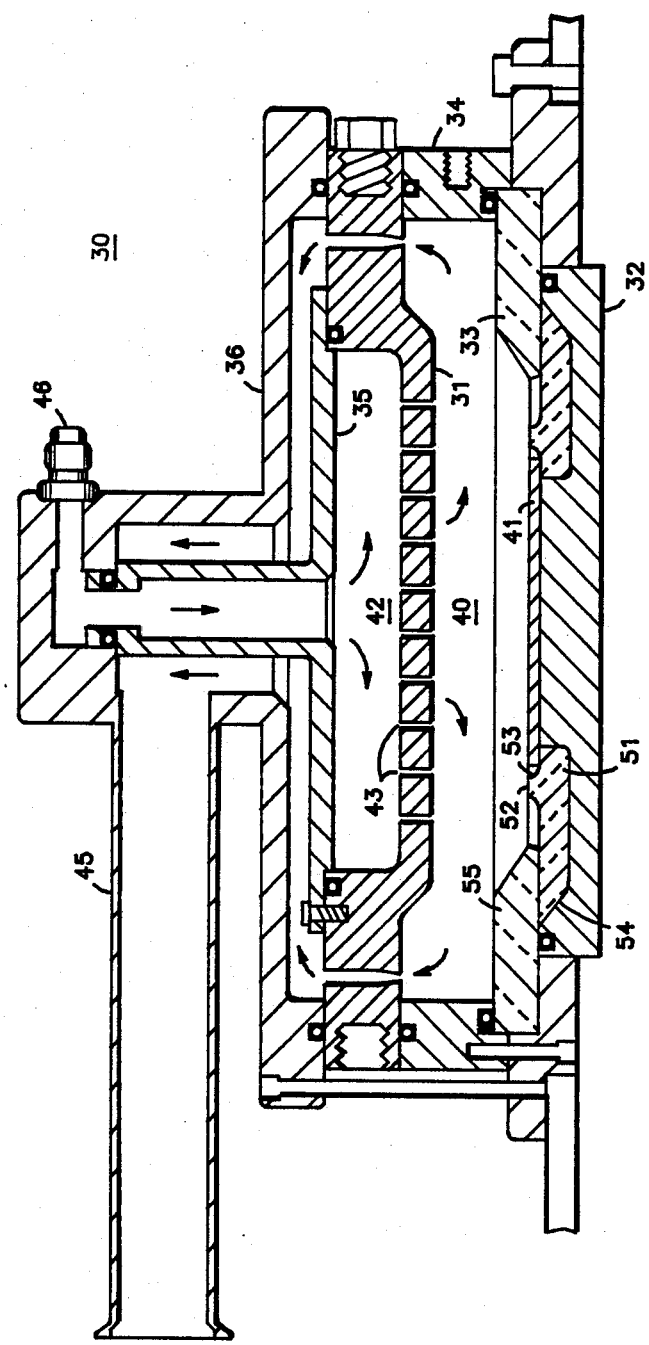
FIG. 3 illustrates a plasma reactor chamber in accordance with the present invention.

FIG. 1 illustrates an exploded view of a portion of a lower electrode assembly in accordance with the present invention. In particular, lower electrode 10 comprises an annular depression 11 defining a central pedestal 12 for receiving a semiconductor wafer. The depth of annular depression 11 and the thickness of ring 13 are chosen so that, for frontside etches, ring 13 is slightly thinner than the depth of depression 11, thereby assuring that pedestal 12 will extend through central aperture 14 and above ring 13. Surrounding central aperture 14 is a raised portion 15. As more fully described hereinafter, raised portion 15 preferably comprises a flat upper portion and beveled sides. Raised portion 15 serves to locate a wafer, not shown, directly above pedestal 12 at the approximate center of the plasma reactor chamber.

Lower electrode 10 typically comprises aluminum. Ring 13, depending upon the process chosen, can comprise a variety of materials. While not part of the present invention, it is believed that the variation in dielectric constant among the various materials usable as ring 13 controls the process parameters and in particular the power distribution within the plasma reactor chamber, thereby obtaining the improved and unexpected results in accordance with the present invention.

By way of example, but not by way of limitation, ring 13 can comprise aluminum when the plasma reactor is used for etching nitride or polysilicon using processes based upon sulfur hexafluoride or a mixture of sulfur hexafluoride and Freon 11. Anodized or hard anodized aluminum can be used with chloride chemistries to reduce loading when etching aluminum. Ring 13 can comprise MACOR (and alumina-mica material sold by Corning Glass) for a backside etch of polysilicon or silicon nitride using sulfur hexafluoride chemistries. Ring 13 can comprise quartz for use in etching photoresist in an oxygen plasma. As known in the prior art there are many chemistries available for a variety of etches. It is understood that the foregoing is merely to illustrate that various materials can be used for ring 13 depending upon the function to be performed.

FIG. 2 illustrates an alternative embodiment of a ring in which ring 21 comprises a central aperture 22 and a plurality of raised portions 23, 24, 25 arranged in a pattern around aperture 22 to provide the same wafer capture function as obtained from raised portion 15 on ring 13 in FIG. 1. The number and location of raised portions 23-25 is not critical although it is appreciated that there must be at least three raised portions in a pattern encompassing more than a semicircle.

With respect to the embodiments of FIGS. 1 and 2, the distance from the outside of the aperture to the inner edge of the raised portion is preferably only sufficient to cover the flat on the wafer and no more. The width of the outer portion of the ring, extending from the outside edge of the ring inwardly to the raised portion, need only be large enough to be overlapped by a mating insulating ring within the plasma reactor, as illustrated in FIG. 3.

In FIG. 3, which illustrates a preferred embodiment of a reactor in accordance with the present invention, plasma reactor 30 comprises an upper electrode 31 and a lower electrode 32. Lower electrode 32 is separated from upper electrode 31 by insulating ring 33 and side wall 34. Upper electrode 31 has attached thereto an interior baffle 35 and cover 36. Cover 36 defines an exhaust chamber which is connected to exhaust tube 45 for removing gases and by-products from about the periphery of the reactor. Baffle 35 provides a path for the gas or gas mixture from a suitable source of supply connected to fitting 46. Upper electrode 31 and lower electrode 32 define a reaction chamber 40 into which wafer 41 is placed for processing. Upper electrode 31 and interior baffle 35 define plenum 42 which serves to equalize the pressure and flow of the gas across the surface of the wafer through a plurality of apertures 43 in upper electrode 31. As thus configured, plasma reactor 30 is what is known in the art as a parallel plate, radial flow reactor. That is, the gases are supplied by a central means and flow radially outward across the wafer where they are collected about the edge of the reactor.

Lower electrode 32 comprises an annular groove having ring 51 placed therein. The annular raised portion of ring 51 preferably comprises a flattened top portion 52, as opposed to a peak, and at least an interior sloped wall 53 for receiving wafer 41. Sloped wall 53 serves two functions, it provides a centering action for the wafer upon receipt from a wafer transport mechanism and, by being larger at the top than at the bottom, reduces the precision with which the wafer transport must locate the wafer within the chamber. It has been found that the interior sloped portion 53 of ring 51 should be as smooth as possible to minimum the generation of particles caused by the rubbing of the wafer thereon during the centering action. This is particularly true when ring 51 comprises quartz or ceramic.

It has been found desirable to slope the outside edge of ring 51 as indicated by reference numeral 54. This not only eases the assembly of ring 51 and lower electrode 32 but minimizes the exposed metal surface of lower electrode 32 about the periphery thereof. This helps to control the plasma or, more particularly, the field and power density of the plasma.

As can be seen from FIG. 3 lower electrode 32 comprises a planar upper surface from which is milled the depression for ring 51. In so doing, lower electrode 32 is easily manufactured and, in particular, the pedestal thereof is easily lapped to a flat surface. Lower electrode 32 also comprises plumbing and electrical connections, not shown, but well-known to those of skill in the art. In operation, lower electrode 32 is typically connected to a source of RF power while upper electrode 31 is held at ground potential.

While indicated as coplanar with the pedestal, ring 51 is not actually coplanar as more fully illustrated in FIGS. 4 and 5. FIG. 4 illustrates a configuration for a frontside etch in which ring 71 has a thickness less than the height of pedestal 51. In particular, there is a gap 61 which may be on the order of 0.010 inches (0.25 mm) between wafer 41 and ring 71. In addition, since wafer 41 is rarely perfectly centered, a gap 62 will exist at least around a portion of the periphery of wafer 41. If gap 62 or gap 61 is of sufficient size, a plasma glow discharge may ignite underneath the wafer destroying the symmetry of the glow discharge and absorbing power from the main discharge, thereby producing a process variation which may not be detected until the wafer has received even further processing. In practice, these discharges can be minimized by keeping gap 61 and gap 62 smaller than approximately 0.010 inches (0.25 mm).

FIG. 5 illustrates a backside etch in which wafer 41 is held above lower electrode 32 forming gap 65. In the backside etch, the active devices are being formed on what is now the lower surface of wafer 41. In the backside etch, the upper surface of wafer 41, as illustrated in FIG. 5, is intended to be etched. Thus gap 65 should be smaller than about 0.010 inches (0.25 mm) to avoid the initiation of a glow discharge between wafer 41 and lower electrode 32.

There is thus provided by the present invention an improved plasma reactor which is easily manufactured yet accommodates a variety of processes and wafer diameters simply by changing the ring material, in the case of different processes, or the lower electrode plate and the ring in the case of different wafer sizes. By restricting the exposed lower electrode to the central area, by way of insulator 33 and ring 51, one obtains better control of the plasma, increases the power and density, and improves uniformity of the etch.

Having thus described the invention it will be apparent to those of skill in the art that various modifications can be made within the spirit and scope of the present invention. For example, while it is understood by those of skill in the art that one wants to obtain maximum contact area between wafer 41 and lower electrode 32, one can accommodate wafers of slightly different size by merely changing ring 51 rather than ring 51 and lower electrode 32. While illustrated as comprising a parallel plate radial flow reaction of a particular configuration, it is understood that various other configurations can benefit from the present invention by modifying the lower electrode thereof. The angles of the various bevels illustrated in the figures is not critical and may comprise, for example, bevels in the range of 30 to 60 degrees. Similarly, it is understood by those of skill in the art that the particular size gap at which a plasma will ignite is determined by a host of factors including for example the pressure within the chamber. Thus, the exact critical dimension is readily obtained empirically depending upon the particular reactor geometry as well as other parameters. Further, while electrode 32 and ring 51 are described as simply comprising quartz or aluminum, it is understood that more complex structures can be used in accordance with the present invention, for example, a ceramic ring 51 having a layer of aluminum deposited thereon.

I claim:

1. In a plasma reactor chamber enclosed by sidewall means, a upper surface, and a lower surface adapted to receive a removable electrode, and wherein said lower surface is electrically separated from said sidewall means by an insulator which extends into said chamber, the improvement comprising:
  said electrode having an annular groove therein; and
  a ring which fits within said groove and extends under said insulator for controlling the electrical characteristics of said chamber.

2. The reactor as set forth in claim 1 wherein said ring has a thickness approximately equal to the depth of said groove and is adapted to receive an article to be treated in said chamber.

3. The plasma reactor as set forth in claim 1 wherein said ring comprises a conductor.

4. The plasma reactor as set forth in claim 1 wherein said ring comprises an insulator.

5. The plasma reactor as set forth in claim 4 wherein said ring comprises a ceramic.

6. The reactor as set forth in claim 2 wherein said ring has a thickness slightly greater than the depth of said groove, to enable said reactor to perform front-side treatment of an article therein.

7. The reactor as set forth in claim 2 wherein said ring has a thickness slightly smaller than the depth of said groove, to enable said reactor to perform backside treatment of an article therein.

* * * * *